United States Patent [19]

Noda et al.

[11] 4,246,543
[45] Jan. 20, 1981

[54] DELAYED AGC CIRCUIT

[75] Inventors: Masaru Noda, Fujisawa; Toshio Murakami; Mamoru Sugita, both of Yokohama, all of Japan

[73] Assignee: Hitachi, Ltd., Japan

[21] Appl. No.: 32,755

[22] Filed: Apr. 24, 1979

[30] Foreign Application Priority Data

Apr. 24, 1978 [JP] Japan .................................. 53-48527

[51] Int. Cl.³ .............................................. H03G 3/30
[52] U.S. Cl. .................................... 330/280; 330/133; 330/134; 330/138; 358/179; 455/243
[58] Field of Search ............... 330/133, 134, 138, 280; 358/179; 455/242, 243

[56] References Cited

U.S. PATENT DOCUMENTS 3,740,471 6/1973 Wilcox .............................. 330/280 X Primary Examiner—James B. Mullins
Attorney, Agent, or Firm—Craig & Antonelli

[57] ABSTRACT

A delayed AGC circuit in which an AGC detection output is divided into two portions, one of them is applied through buffer means to an IF amplification stage to thereby control the gain thereof, and the other portion is applied to a tuner through a threshold circuit to thereby control the gain thereof. A variable resistor or potentiometer for AGC delay adjustment and a high-frequency bypass device are connected at a point in the AGC signal path from the output of the buffer means to the IF amplification stage.

7 Claims, 4 Drawing Figures

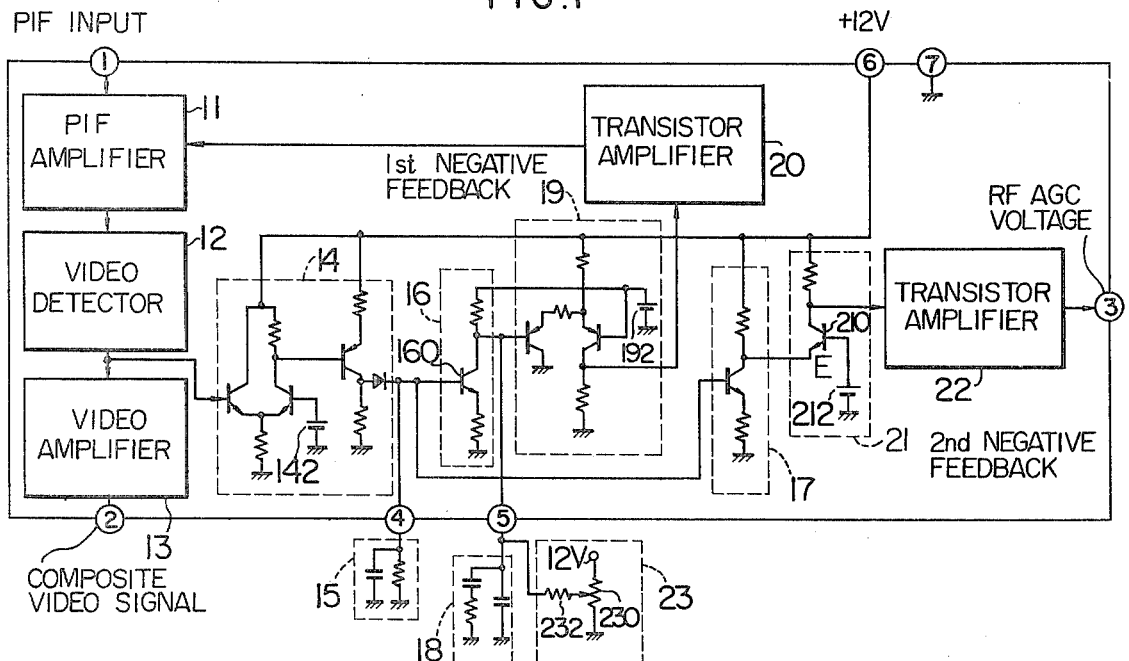
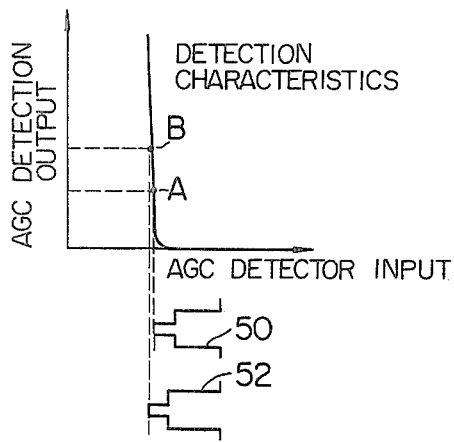
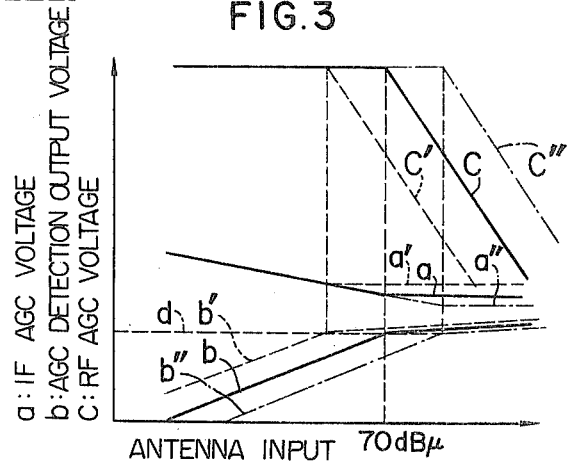
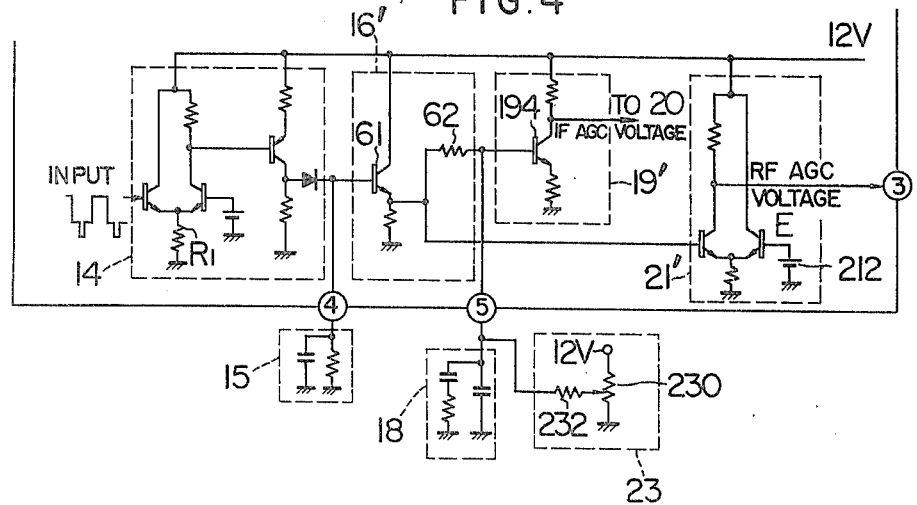

DELAYED AGC CIRCUIT

BACKGROUND OF THE INVENTION

The present invention relates to a delayed AGC circuit used in a high-frequency signal receiver such as a television receiver having a high-frequency amplification stage and an intermediate frequency amplification stage, or more in particular to a delayed AGC circuit suitable for a semiconductor integrated circuit construction.

The gain of the high-frequency amplification stage (hereinafter referred to as an RF amplification stage) and the video intermediate frequency amplification stage (hereinafter referred to as a PIF amplification stage) of the television receiver is controlled by automatic gain control (hereinafter referred to as AGC) voltage changing with the antenna input electric field, i.e., the video detection output so that a uniform video detection output may be provided even when the antenna input electric field undergoes a change.

The delayed AGC circuit has first and second negative feedback control states. Under the first negative feedback control state, the RF amplification stage is operated at a maximum gain while the PIF amplification stage alone is subjected to automatic gain control from the view points of the noise characteristics and mixing and/or modulation when the antenna input electric field is weaker than a predetermined level, e.g., 70 dBμ. Under the second negative feedback control state, on the other hand, the gains of both the RF and PIF amplification stages are controlled in such a manner that the gain of the PIF amplification stage undergoes substantially no change while the change in the gain of the RF amplification stage is dominant when the antenna input electric field is stronger than the abovementioned predetermined level.

The delayed AGC circuit thus comprises a switch for switching its conditions in accordance with whether the AGC voltage has exceeded a predetermined level and an adjustable setting means for setting the predetermined level. By the condition of the switch, switching between the first negative feedback state and the second negative feedback state is accomplished.

An integrated circuit (hereinafter referred to as IC) containing the PIF amplification stage, an AGC detector stage and the switch making up the abovementioned delayed AGC circuit in a single chip is disclosed as AN247P in the Japanese publication "'77 National Semiconductor Handbook" issued on June 30, 1976. This well-known IC AN247P has two terminals connected with input and output terminals of a filter for removing the ripple and a high-frequency component thereof for horizontal and vertical periods from the detection voltage generated by the AGC detection means, and a terminal supplied with a reference voltage for setting AGC voltage level for switch change-over. The two IC terminals connected with the input and output terminals of the filter are connected to the output terminal of the AGC detection stage and the gain control terminal of the IF amplification stage within the IC chip, respectively.

With the increase in the scale of integration within the IC chip, cost is reduced and reliability is improved. In view of this, efforts are being made to increase the scale of integration of the IC for the television receiver. The structural restraint of IC as a component, however, limits the number of IC connecting pins, i.e. the number of IC terminals, which in turn limits the scale of integration of circuits incorporated in an IC chip. As a result, it is necessary to reduce as far as possible the number of the IC terminals required for the circuits contained in the IC chip in order to increase the scale of integrated circuitry.

SUMMARY OF THE INVENTION

An object of the present invention is to provide a delayed AGC circuit with a decreased number of IC terminals.

According to the present invention, there is provided a delayed AGC circuit comprising a first amplification means, a second amplification means for amplifying an output signal of the first amplification stage, a detector means for generating a detection voltage in accordance with the output signal of the second amplification means, a filter means for smoothing the detection voltage, a first negative feedback means for negatively feeding back the smoothed detection voltage to the second amplification means, and a second negative feedback means for supplying the negative feedback voltage to the first amplification means when the smoothed detection voltage compared with a predetermined reference voltage exceeds the latter, the delayed AGC circuit further comprising a buffer means provided between the detector means and the filter means in such a manner that the output of the detector means is unidirectionally applied to the filter means, the filter means smoothing the detection voltage produced from the buffer means, means for superimposing a variable DC voltage on the smoothed detection voltage, and means for negatively feeding back the superimposed voltage to the second amplification means so that the detection voltage of the detector means is changed with the variable DC voltage, thereby fixing the reference voltage in the second negative feedback means and thus dispensing with the reference voltage-changing means from the second negative feedback means.

BRIEF DESCRIPTION OF THE DRAWINGS

FIG. 1 is a circuit diagram showing an embodiment of the delayed AGC circuit according to the present invention.

FIG. 2 is a diagram showing the detection characteristic of the AGC detection stage.

FIG. 3 is a characteristic diagram showing the relation between the antenna input electric field and the AGC DC voltage.

FIG. 4 is a circuit diagram showing another embodiment of the delayed AGC circuit according to the present invention.

DESCRIPTION OF THE PREFERRED EMBODIMENTS

In FIG. 1, the circuit elements surrounded by solid lines are circuits contained in an IC chip, while those circuit elements outside of the circuits surrounded by solid lines show external circuits provided outside the IC. The solid lines should be understood to merely represent boundaries for IC, but not connection lines. This IC chip comprises a noise rejection circuit for suppressing noises in the video signal detected and an automatic frequency control circuit for detecting the variation in the oscillation frequency of the local oscillator of the tuner and generating an automatic frequency control voltage supplied to the local oscillator for suppressing the variation thereof. These circuits, however, are not directly related to the subject of the present invention and, therefore are not shown in the drawing.

An external IC terminal 1 is supplied with a video intermediate frequency signal (PIF) passed through a filter having a predetermined selectivity characteristic. A composite video signal is taken out from the IC terminal 1, while an RF AGC voltage for gain control of the RF amplification stage (not shown) is produced from an external IC terminal 3. External connection terminals 4 and 5 are connected with filters 15 and 18 for smoothing an AGC detection voltage, and an operating voltage of 12 volts for operating the circuits in the IC chip is supplied between external connection terminals 6 and 7.

The video intermediate frequency signal applied to the terminal 1 is amplified by a PIF amplifier 11 and subjected to video detection by a video detector 12 into a composite video signal containing a synchronizing signal. This composite video signal is supplied to a video amplifier 13 on the one hand and to an AGC detector 14 on the other hand. The AGC detector 14 generates a detection voltage representing the variation in the magnitude of the reference portion such as the amplitude of the synchronizing signal included in the composite video signal.

This detection voltage is smoothed by the filter 5 connected at the terminal 4 and then applied to a first AGC amplifier 16 and a second AGC amplifier 17. An output voltage of the first AGC amplifier 16 is smoothed by the filter 18 connected with the terminal 5, amplified by a first negative feedback means including a third AGC amplifier 19 and a transistor amplifier 20, and then negatively fed back to the PIF amplifier 11 as a gain control voltage for the PIF amplifier 11. An output voltage of the second AGC amplifier 17, on the other hand, is supplied to a threshold circuit 21 making up a second negative feedback means. An output voltage of the threshold circuit 21 is amplified by a transistor amplifier 22 and negatively fed back to the RF amplification stage of the tuner as a delayed RF AGC voltage. In the case where an input voltage to the threshold circuit 21 is lower than a voltage E of a reference voltage source 212 connected to the base of a transistor 210, the transistor 210 conducts and therefore produces an output voltage changing with the input voltage. In the event that the input voltage to the threshold circuit 21 is higher than the voltage E, by contrast, the transistor 210 is cut off and therefore the output voltage thereof remains constant regardless of any change in the input voltage. Although the reference voltage source 212, a voltage source 142 for the AGC detector 14 and a voltage source 192 for the third AGC amplifier 19 are shown as independent voltage source, they are actually formed within the IC chip by an appropriate voltage-divider circuit for dividing the voltage of 12 V supplied between the terminals 6 and 7. A regulator or adjusting circuit 23 connected with the terminal 5 serves for regulating the lower limit of the range of the antenna input electric field in which the RF AGC voltage is subject to a change with the antenna input electric field, i.e., the upper limit of the range of the antenna input electric field in which the RF AGC voltage remains constant against variations in the antenna input electric field (such limits being hereinafter referred to as the delayed point).

The regulator 23 includes a variable resistor or potentiometer 230 for dividing the voltage of 12 volts and a resistor 232 for transmitting to the terminal 5 a divided voltage produced at a movable contact of a potentiometer 230. The resistor 232 is used for preventing the terminal 5 from being connected with a low impedance against the power supply even when the movable contact of the potentiometer 230 approaches the 12 V side or ground side. Thus, the regulator 23 acts as a variable current source.

In the circuits mentioned above, the delayed AGC circuit operates as described below. First, it is required to recognize that the detection characteristic curve of the AGC detector 14 is very steep as shown in FIG. 2. In response to a slight change in the magnitude (for instance, from 50 to 52) of the composite video signal input to the AGC detector 14, therefore, the AGC detection output undergoes a great change (from A to B). This shows the fact that a change, if any, caused in the DC voltage by an external source in the path of AGC voltage from the output of the AGC detector 14 to the PIF amplifier 11 or the RF amplification stage of the tuner results in so small a change in the magnitude of the composite video signal applied to the AGC detector 14 that the video detection output level is not substantially affected, i.e., the fact that the DC level of the AGC detection output is capable of being adjusted without substantially changing the video detection output level.

With this fact in mind, the relation between the IF AGC voltage, AGC detection output voltage and the RF AGC voltage will be discussed below with reference to FIG. 3. In FIG. 3, the solid lines a, b and c show the cases in which the delayed point is regulated at a standard value (70 dBµ). More specifically, a represents the If AGC voltage applied to the PIF amplifier 11 as a gain control voltage, b the AGC detection output voltage produced at the terminal 4, and c the RF AGC voltage produced at the terminal 3. Reference character d shows the threshold value of the threshold circuit 21 as converted into the voltage at the AGC detection output point (terminal 4). With the increase in the intensity of antenna input electric field, the AGC detection output voltage increases along the line b up to the point of 70 dBµ. At the same time, the IF AGC voltage decreases along the line a. In the meantime, the RF AGC voltage remains constant. At the input electric field of 70 dBµ, the AGC detection output voltage reaches the threshold value d where the transistor 210 of the threshold circuit 21 begins to conduct. At the input electric field intensity beyond the threshold level d, the RF AGC voltage decreases along the line c. In view of the fact that the AGC loop gain for RF is much greater than that for IF, the RF AGC becomes dominant while the IF AGC substantially ceases.

With the approach of the movable contact or slider of the potentiometer 230 of the regulator 23 toward the 12 V line, the delayed point moves nearer to the lower intensity side of the electric field; while with the approach of the slider to ground, the delayed point moves to the stronger intensity side of the electric field.

When the slider is moved to the 12 V side from the position thereof associated with the delayed point of 70 dBµ, the DC level of the terminal 5 tends to increase. This upward trend is dampened by the AGC function, and therefore the DC level at the terminal 5 remains constant regardless of the position of the slider. In other words, as obvious from the explanation with reference to FIG. 2, the video detection output level is not affected by the movement of the slider. The movement of the slider, however, results in a change in the AGC detection output voltage produced at the terminal 4. When the DC level at the terminal 5 tends to increase, the DC level of the AGC detection output voltage, i.e., the DC level at the terminal 4 is increased by the AGC function so that the collector voltage of a transistor 160 drops, and therefore the increase in the DC level at the terminal 5 is offset. In other words, the AGC detection output voltage increases in the same input electric field, while the AGC detection output voltage reaches the threshold value d in a weaker electric field. As a result, the delayed point moves to the weaker side of the electric field. The AGC detection output voltage thus moves from point b to b' in FIG. 3, and the RF AGC voltage begins to decrease from the weak electric field along the line c'. At the same time, the IF AGC voltage moves also from a to a'.

When the slider is moved to the ground side, the reverse is the case. In other words, the IF AGC voltage, AGC detection output voltage and RF AGC voltage take the forms of a", b" and c" in FIG. 3 respectively, so that the delayed point moves further to the stronger electric field.

Since the filter 18 and the regulator 23 for regulating the delayed point are connected to a common terminal 5, the terminals required separately for the regualtor and the filter in the conventional system are reduced by one according to the present invention.

The filter 18 in FIG. 1 has no effect on the RF AGC voltage. In all cases, however, there is a junction point between the terminal 3 of the IC chip and the RF AGC terminal of the tuner where a high-frequency bypass means may be inserted as a common practice. Therefore, no problem is posed even if the filter 18 has no effect on the RF AGC voltage. Further, the junction point is generally connected with a capacitor for preventing the mixing of an interference signal, which capacitor may double as a high-frequency bypass means, thus eliminating the need for increasing the circuit component parts.

The filter 18 may be comprised of only a capacitor or a series circuit including a capacitor and a resistor depending on the magnitude of the ripple or high frequency portion of the AGC voltage or stability of the AGC operation. Also, the terminal 5 may be located at another point in the IF AGC signal path such as at the input of the amplifier 20. It is also possible to eliminate the third AGC amplifier circuit 19. Furthermore, in view of the fact that the first AGC amplifier circuit 16 acts as a kind of buffer circuit for preventing a prior stage from being adversely affected by the reversal of the DC level variation through the AGC signal path, the first AGC amplifier circuit 16 may be replaced with equal effect by a resistor having a sufficiently high impedance as compared with the output impedance of the AGC detector 14.

FIG. 4 shows a circuit according to another embodiment of the present invention. A buffer amplifier 16' includes an emitter-follower transistor 61 and a resistor 62; an amplifier 19' includes a transistor 194; and a threshold circuit 21' includes a differential amplifier. The output voltage of the AGC detector 14 is divided into halves after being buffer-amplified by the emitter-follower transistor 61. One portion of the divided voltage is applied through a resistor 62 and a transistor 194 to the amplifier 20 in the form of IF AGC voltage. In the stage after the resistor 62, a terminal 5 is provided to which the filter 18 and the regulator 23 are connected. The other portion of the divided voltage is applied to the threshold circuit 21' the output voltage of which is applied through the amplifier 22 (not shown) as an RF AGC voltage to the terminal 3. This threshold circuit 21' so operates that when the input voltage thereof increases beyond the voltage E of the reference voltage source 212, the RF AGC voltage drops. If the value of the resistor 62 is sufficiently large as compared with the output impedance of the AGC detector 14, the resistor 62 acts as a buffer and therefore, the transistor 61 may be eliminated. The terminal 5 may be connected alternatively to the collector of the transistor 61.

The above-described embodiments according to the invention concern the gain control characteristics of the PIF amplification stage and the RF amplification stage in which the gain decreases with the reduction of the AGC voltage. It is also of course possible to design the circuit according to the present invention conforming to the characteristics reverse to those mentioned above or combination of different characteristics.

We claim:

1. A delayed AGC circuit comprising:
   (a) first amplifier means for amplifying a signal having a reference portion,
   (b) second amplifier means for amplifying further an output signal of said first amplifier means,
   (c) detector means for generating a detection voltage changing with the magnitude of the reference portion of said output signal of said second amplifier means,
   (d) buffer means having an input terminal and an output terminal connected to said detector means, in which a signal is transmitted from the input terminal to the output terminal while no signal is transmitted from the output terminal to the input terminal,
   (e) filter means connected to the output terminal of said buffer means for smoothing the detection voltage that has passed through said buffer means,
   (f) first negative feedback means for negatively feeding back the smoothed detection voltage to the second amplifier means thereby to control the gain of said second amplifier means,
   (g) comparator means connected to said detector means, including a first input terminal supplied with the detection voltage, a second input terminal supplied with a fixed reference voltage and an output terminal, said comparator means producing a predetermined output voltage at the output terminal thereof when the voltage at the first input terminal is lower than the voltage at the second input erminal, and an output voltage corresponding to an excess voltage at the output terminal thereof when the voltage at the first input terminal exceeds the voltage at the second input terminal,
   (h) second negative feedback means for negatively feeding back to the first amplifier means the output voltage generated at the output terminal of said comparator means to thereby control the gain of said first amplifier means, and
   (i) variable voltage superimposing means for supplying a variable current to the filter means, for generating a variable voltage corresponding to said variable current, and for superimposing said variable voltage on the smoothed detection voltage, thereby changing the detection voltage applied to said buffer means, in accordance with said variable voltage.

2. A delayed AGC circuit according to claim 1, wherein said first amplifier means includes an RF amplifier for amplifying an RF signal, and said second amplifier means includes an IF amplifier for amplifying an IF signal frequency-converted from an output signal of said RF amplifier.

3. A delayed AGC circuit according to claim 2, wherein said variable voltage superimposing means includes a variable current source.

4. A delayed AGC circuit according to claim 2, wherein said buffer means includes an amplifier of a high output impedance.

5. A delayed AGC circuit according to claim 2, wherein said buffer means includes a resistor having an impedance value sufficiently high as compared with the output impedance of said detector means.

6. A delayed AGC circuit according to claim 1, wherein said second negative feedback means includes another filter means for smoothing the negatively fed back voltage.

7. An integrated circuit for a delayed AGC circuit formed in a monolithic semiconductor chip comprising:
   (a) first amplifier means for amplifying a signal having a reference portion,
   (b) second amplifier means for amplifying further an output signal of said first amplifier means,
   (c) detector means for generating a detection voltage changing with the magnitude of the reference portion of said output signal of said second amplifier means,
   (d) buffer means having an input terminal and an output terminal connected to said detector means, transmitting a signal unidirectionally from the input terminal to the output terminal,
   (e) an external connection terminal for connecting an external filter means to the output terminal of said buffer means, said filter means smoothing the detection voltage that has passed through said buffer means,
   (f) first negative feedback means for negatively feeding back the smoothed detection voltage to the second amplifier means to thereby control the gain of said second amplifier means,
   (g) comparator means connected to said detector means, including a first input terminal supplied with the detection voltage, a second input terminal supplied with a fixed reference voltage and an output terminal, said comparator means producing a predetermined output voltage at the output terminal thereof when the voltage at the first input terminal is lower than the voltage at the second input terminal, and an output voltage corresponding to an excess voltage at the output terminal thereof when the voltage at the first input terminal exceeds the voltage at the second input terminal,
   (h) second negative feedback means for negatively feeding back to the first amplifier means the output voltage generated at the output terminal of said comparator means to thereby control the gain of said first amplifier means, and
   (i) said external connection terminal connecting an external variable voltage supply means for supplying a variable current to the filter means, for generating a variable voltage corresponding to said variable current, and for superimposing said variable voltage on the smoothed detection voltage, thereby changing the detection voltage applied to said buffer means, in accordance with said variable voltage.

* * * * *